US012684771B2

(12) United States Patent
Jung

(10) Patent No.: US 12,684,771 B2
(45) Date of Patent: Jul. 14, 2026

(54) SEMICONDUCTOR MEMORY DEVICE WITH IMPROVED DEGREE OF INTEGRATION

(71) Applicant: SK hynix Inc., Icheon-si (KR)

(72) Inventor: Sung Wook Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 572 days.

(21) Appl. No.: 18/099,418

(22) Filed: Jan. 20, 2023

(65) Prior Publication Data

US 2024/0032296 A1     Jan. 25, 2024

(30) Foreign Application Priority Data

Jul. 25, 2022     (KR) ........................ 10-2022-0091796

(51) Int. Cl.
*H10B 43/27*          (2023.01)
(52) U.S. Cl.
CPC .................................. *H10B 43/27* (2023.02)
(58) Field of Classification Search
CPC ........ H10B 53/00; H10B 53/10; H10B 53/20;
H10B 53/30; H10B 53/40; H10B 53/50;
H10B 41/00; H10B 41/10; H10B 41/20;
H10B 41/23; H10B 41/27; H10B 41/30;
H10B 41/35; H10B 41/40–44; H10B
41/46–50; H10B 41/60; H10B 41/70;
H10B 43/00; H10B 43/10; H10B 43/20;
H10B 43/23; H10B 43/27; H10B 43/30;
H10B 43/35; H10B 43/40; H10B 43/50;
H10B 51/00; H10B 51/10; H10B 51/20;
H10B 51/30; H10B 51/40; H10B 51/50
See application file for complete search history.

(56) References Cited

U.S. PATENT DOCUMENTS

| | | | | |
|---|---|---|---|---|
| 2014/0293695 A1* | 10/2014 | Kono | ..................... | H10B 43/30 |
| | | | | 365/185.11 |
| 2015/0206898 A1 | 7/2015 | Chen | | |
| 2016/0343442 A1* | 11/2016 | Masuoka | ............... | H10B 41/27 |
| 2017/0125433 A1 | 5/2017 | Ogawa et al. | | |
| 2017/0200733 A1* | 7/2017 | Lee | ......................... | H10B 43/10 |
| 2020/0152273 A1* | 5/2020 | Lee | ......................... | H10B 41/10 |
| 2020/0312765 A1* | 10/2020 | Kawasaki | .............. | H10B 41/35 |
| 2022/0123005 A1* | 4/2022 | Lee | ......................... | H10B 41/27 |

FOREIGN PATENT DOCUMENTS

| | | |
|---|---|---|
| KR | 1020170017357 A | 2/2017 |
| KR | 1020200055595 A | 5/2020 |
| KR | 1020200137077 A | 12/2020 |
| KR | 1020210102986 A | 8/2021 |
| KR | 1020210128627 A | 10/2021 |

* cited by examiner

*Primary Examiner* — William B Partridge
*Assistant Examiner* — Gustavo G Ramallo
(74) *Attorney, Agent, or Firm* — WILLIAM PARK AND ASSOCIATES LTD.

(57)          ABSTRACT

A semiconductor memory device includes: a gate stack structure including a plurality of conductive patterns; a channel structure disposed inside the gate stack structure, the channel structure having a cross-sectional structure including a major axis and a minor axis, which faces in directions intersecting each other; and two or more bit lines extending in a direction intersecting the major axis of the channel structure, the two or more bit lines being arranged to be spaced apart from each other in a direction in which the major axis of the channel structure faces.

17 Claims, 14 Drawing Sheets

DPS

SEMICONDUCTOR MEMORY DEVICE WITH IMPROVED DEGREE OF INTEGRATION

CROSS-REFERENCE TO RELATED APPLICATION

The present application claims priority under 35 U.S.C. § 119(a) to Korean patent application number 10-2022-0091796, filed on Jul. 25, 2022, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device.

2. Related Art

In order to improve the degree of integration of semiconductor memory devices, three-dimensional semiconductor memory devices have been proposed.

A three-dimensional semiconductor memory device may include a memory cell string defined along a channel structure. In the three-dimensional semiconductor memory device, a plurality of channel structures may be formed in a gate stack structure including a plurality of conductive patterns. The plurality of channel structures may be connected to a plurality of bit lines. Various plans for improving the degree of integration of the three-dimensional semiconductor memory device have been proposed, but there is a limitation in improving the degree of integration while ensuring the stability of a manufacturing process.

SUMMARY

In accordance with an embodiment of the present disclosure, there may be provided a semiconductor memory device including: a gate stack structure having a surface extending in a first direction and a second direction, which intersect each other, the gate stack structure including a plurality of conductive patterns disposed to be spaced apart from each other in a third direction intersecting the surface; a channel structure disposed inside the gate stack structure, the channel structure having a cross-sectional structure including a major axis facing in the first direction and a minor axis facing in the second direction; a memory layer between the channel structure and the gate stack structure; two or more bit lines disposed above the gate stack structure, the two or more bit lines extending in a direction intersecting the major axis of the channel structure, the two or more bit lines being arranged to be spaced apart from each other in a direction in which the major axis of the channel structure faces; and a conductive contact structure connected between one of the two or more bit lines and the channel structure.

In accordance with an embodiment of the present disclosure, there may be provided a semiconductor memory device including: a gate stack structure having a surface extending in a first direction and a second direction, which intersect each other, the gate stack structure including a plurality of conductive patterns disposed to be spaced apart from each other in a third direction intersecting the surface; a plurality of channel structures disposed in the first direction and the second direction inside the gate stack structure, the plurality of channel structures having a cross-sectional structure including a major axis facing in the first direction and a minor axis facing in the second direction; a plurality of memory layers between the plurality of channel structures and the gate stack structure; a plurality of bit lines disposed above the gate stack structure, the plurality of bit lines being arranged to be spaced apart from each other in a direction in which the major axes of the plurality of channel structures face; and a plurality of conductive contact structures connecting the plurality of bit lines to the plurality of channel structures.

In accordance with an embodiment of the present disclosure, there may be provided a semiconductor memory device including: a gate stack structure having a surface extending in a first direction and a second direction, which intersect each other, the gate stack structure including a plurality of conductive patterns disposed to be spaced apart from each other in a third direction intersecting the surface; first to third channel structures disposed inside the gate stack structure, the first to third channel structures having a cross-sectional structure including a major axis facing in the first direction and a minor axis facing in the second direction, the first to third channel structures being arranged substantially at apexes of a triangle; a memory layer between each of the first to third channel structures and the gate stack structure; first to third bit lines disposed above the gate stack structure, the first to third bit lines being arranged to be spaced apart from each other in a direction in which the major axis of each of the first to third channel structures faces; and first to third conductive contact structures connecting the first to third bit lines to the first to third channel structures.

BRIEF DESCRIPTION OF THE DRAWINGS

Various examples of embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it may be the only element between the two elements, or additional intervening elements may also be present. Like reference numerals refer to like elements throughout the drawings.

FIG. 5B is an enlarged view of a cell plug shown in FIG. 5A.

FIG. 6 illustrates a section of the semiconductor memory device taken along line I-I' shown in FIG. 5A.

FIG. 8B is an enlarged view of a first cell plug, a second cell plug, and a third cell plug, which are shown in FIG. 8A.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements.

Embodiments provide a semiconductor memory device capable of improving the stability of a manufacturing process and the degree of integration.

Figure 1:
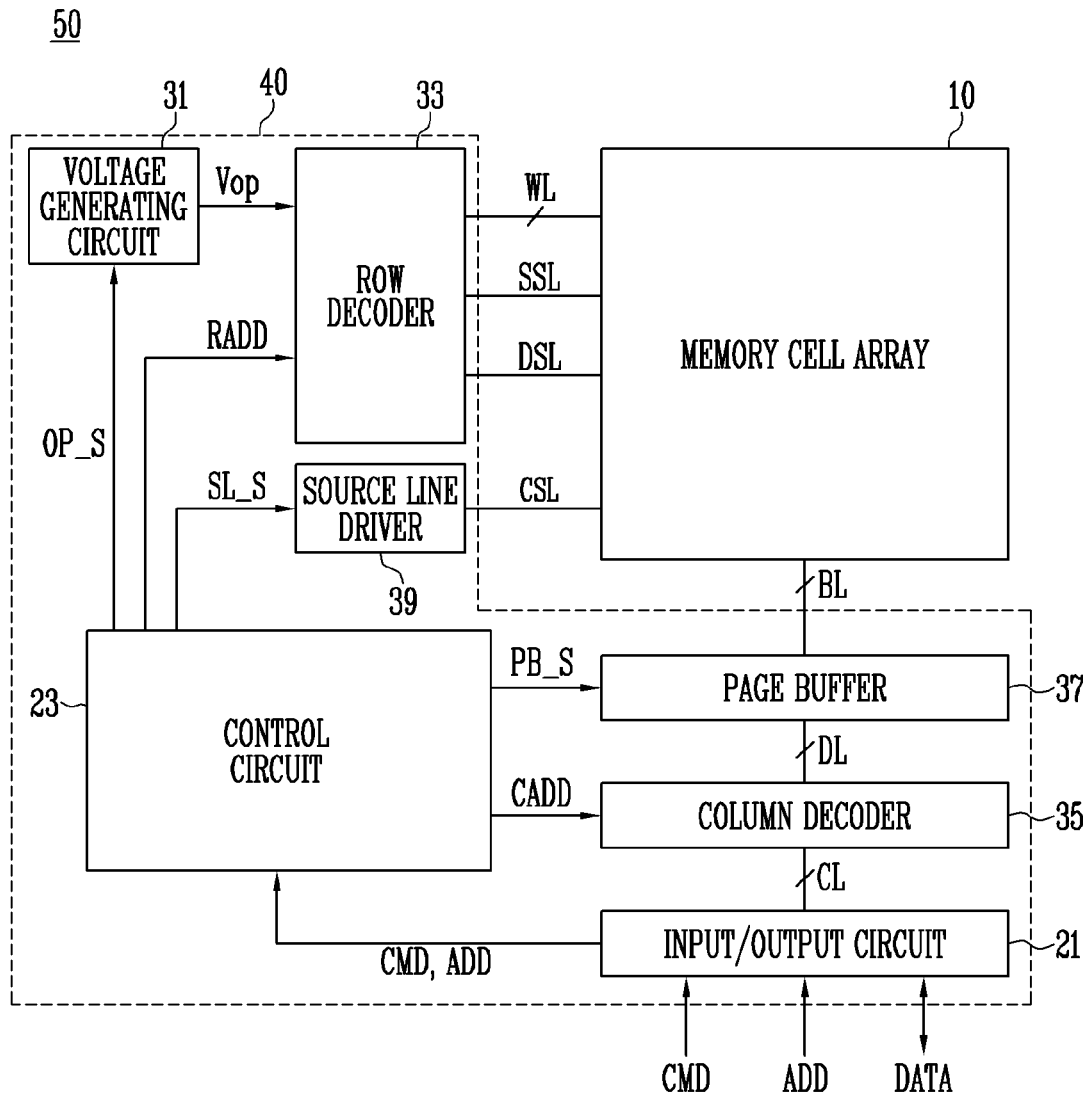
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 50 may include a peripheral circuit structure 40 and a memory cell array 10.

The peripheral circuit structure 40 may be configured to perform a program operation for storing data in the memory cell array 10, a read operation for outputting data stored in the memory cell array 10, and an erase operation for erasing data stored in the memory cell array 10. In an embodiment, the peripheral circuit structure 40 may include an input/output circuit 21, a control circuit 23, a voltage generating circuit 31, a row decoder 33, a column decoder 35, a page buffer 37, and a source line driver 39.

The memory cell array 10 may include a plurality of memory cell strings. Each memory cell string may be connected to the peripheral circuit structure 40 through a common source line CSL, a bit line BL, a drain select line DSL, a word line WL, and a source select line SSL.

The input/output circuit 21 may transfer, to the control circuit 23, a command CMD and an address ADD, which received from an external device (e.g., a memory controller) of the semiconductor memory device 50. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operating voltages Vop used for a program operation, a read operation, and an erase operation in response to the operation signal OP_S.

The row decoder 33 may transfer the operating voltages Vop to the drain select line DSL, the word line WL, and the source select line SSL in response to the row address RADD.

The column decoder 35 may transmit data DATA input from the input/output circuit 21 to the page buffer 37 or transmit data DATA stored in the page buffer 37 to the input/output circuit 21 in response to the column address CADD. The column decoder 35 may exchange data DATA with the input/output circuit 21 through a column line CL. The column decoder 35 may exchange data DATA with the page buffer 37 through a data line DL.

The page buffer 37 may store data DATA received through the bit line BL in response to the page buffer control signal PB_S. The page buffer 37 may sense a voltage or current of the bit line BL in a read operation.

The source line driver 39 may control a voltage applied to the common source line CSL in response to the source line control signal SL_S.

Figure 2:
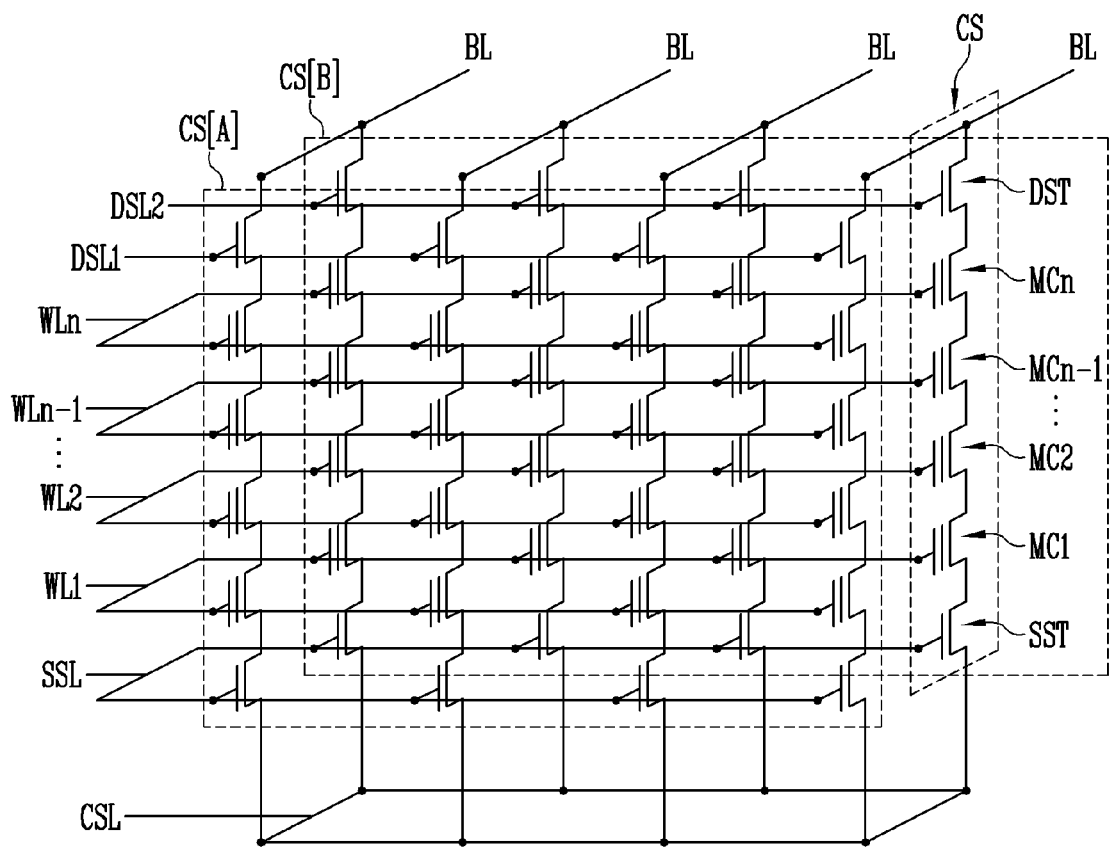
FIG. 2 is a circuit diagram illustrating a memory cell string in accordance with an embodiment of the present disclosure.

FIG. 2 is a circuit diagram illustrating a memory cell string in accordance with an embodiment of the present disclosure.

Referring to FIG. 2, a plurality of memory cell strings CS may be connected in parallel to a common source line CSL. The plurality of memory cell strings CS may be connected to a plurality of bit lines BL. The common source line CSL and each bit line BL may be connected to a channel structure of a corresponding memory cell string CS.

A channel structure of each memory cell string CS may be connected to the common source line CSL through a doped semiconductor structure, and be connected to the source line driver 39 shown in FIG. 1 through a common source line CSL. An operating voltage for discharging a potential of the channel structure of the memory cell string CS may be applied to the common source line CSL.

The channel structure of each memory cell string CS may be connected to a bit line BL corresponding thereto through a conductive contact structure, and be connected to the page buffer 37 shown in FIG. 1 through the bit line BL. An operating voltage for precharging a channel structure of a corresponding memory cell string CS may be applied to each bit line BL.

Each memory cell string CS may include at least one source select transistor SST, a plurality of memory cells MC1 to MCn, and at least one drain select transistor DST. The plurality of memory cells MC1 to MCn may be connected in series between the source select transistor SST and the drain select transistor DST. The source select transistor SST, the plurality of memory cells MC1 to MCn, and the drain select transistor DST may be connected in series by a channel structure.

The plurality of memory cells MC1 to MCn of the memory cell string CS may be connected to the common source line CSL via the source select transistor SST. The plurality of memory cells MC1 to MCn of the memory cell string CS may be connected to a corresponding bit line BL via the drain select transistor DST.

Each memory cell string CS may be connected to a source select line SSL, a plurality of word lines WL1 to WLn (n is a natural number of 2 or more), and a drain select line DSL1 or DSL2. The source select line SSL may be used a gate electrode of the source select transistor SST. The plurality of word lines WL1 to WLn may be used as gate electrodes of the plurality of memory cells MC1 to MCn. The drain select line DSL1 or DSL2 may be used as a gate electrode of the drain select transistor DST.

Each of the plurality of word lines WL1 to WLn may be configured to control the plurality of memory cell strings CS. The plurality of memory cell strings CS may be divided into memory cell string groups. Each bit line BL may be connected to memory cell strings CS included in different memory cell string groups. FIG. 2 illustrates a first memory cell string group CS[A] and a second memory cell string group CS[B], but the present disclosure is not limited to the number of the memory cell string groups shown in the drawing.

A memory cell string of the first memory cell string group CS[A] and a memory cell string of the second memory cell string group CS[B] may be connected to each bit line BL. The first memory cell string group CS[A] and the second memory cell string group CS[B] may be individually controlled by drain select lines isolated from each other or source select lines isolated from each other. In an embodiment, the first memory cell string group CS[A] may be connected to a first drain select line DSL1, and the second memory cell string group CS[B] may be connected to a second drain select line DSL2. The first memory cell string group CS[A] and the second memory cell string group CS[B] may be connected to the same source select line SSL. However, the embodiment of the present disclosure is not limited thereto. In another embodiment, memory cell string groups connected to the same bit line BL may be connected to the same drain select line, and be respectively connected to source select lines isolated from each other. In still another embodiment, memory cell string groups connected to the same bit line BL may be respectively connected to drain select lines isolated from each other, and be respectively connected to source select lines isolated from each other.

Figure 3A:
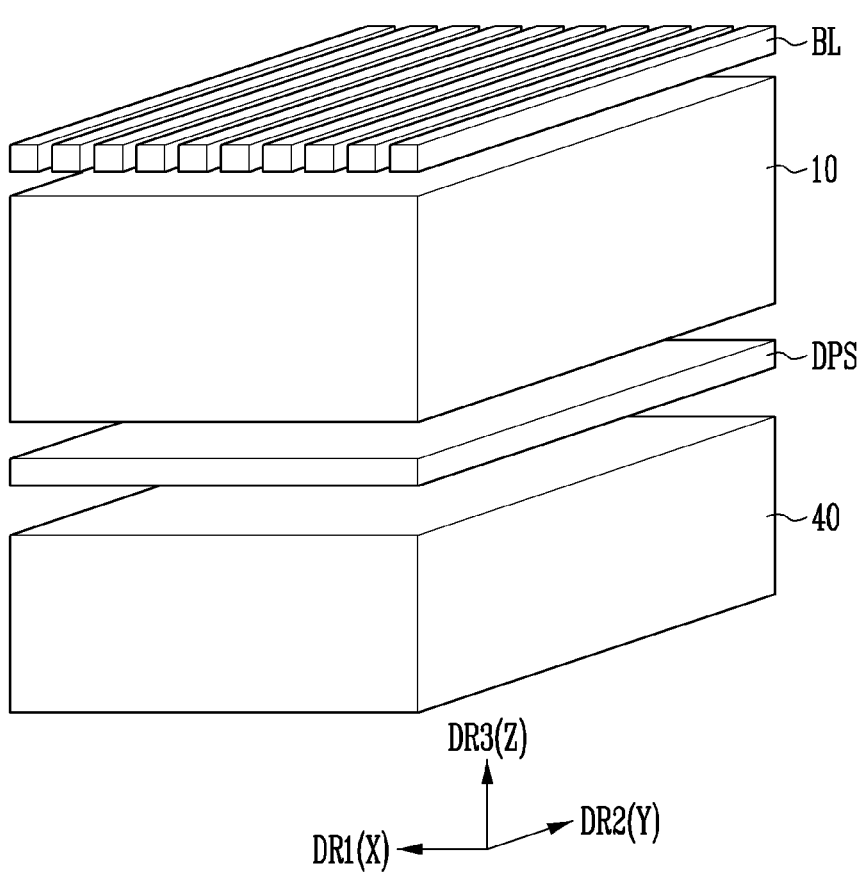
FIGS. 3A and 3B are views illustrating vertical arrangements of a semiconductor memory device in accordance with embodiments of the present disclosure.
Figure 3B:
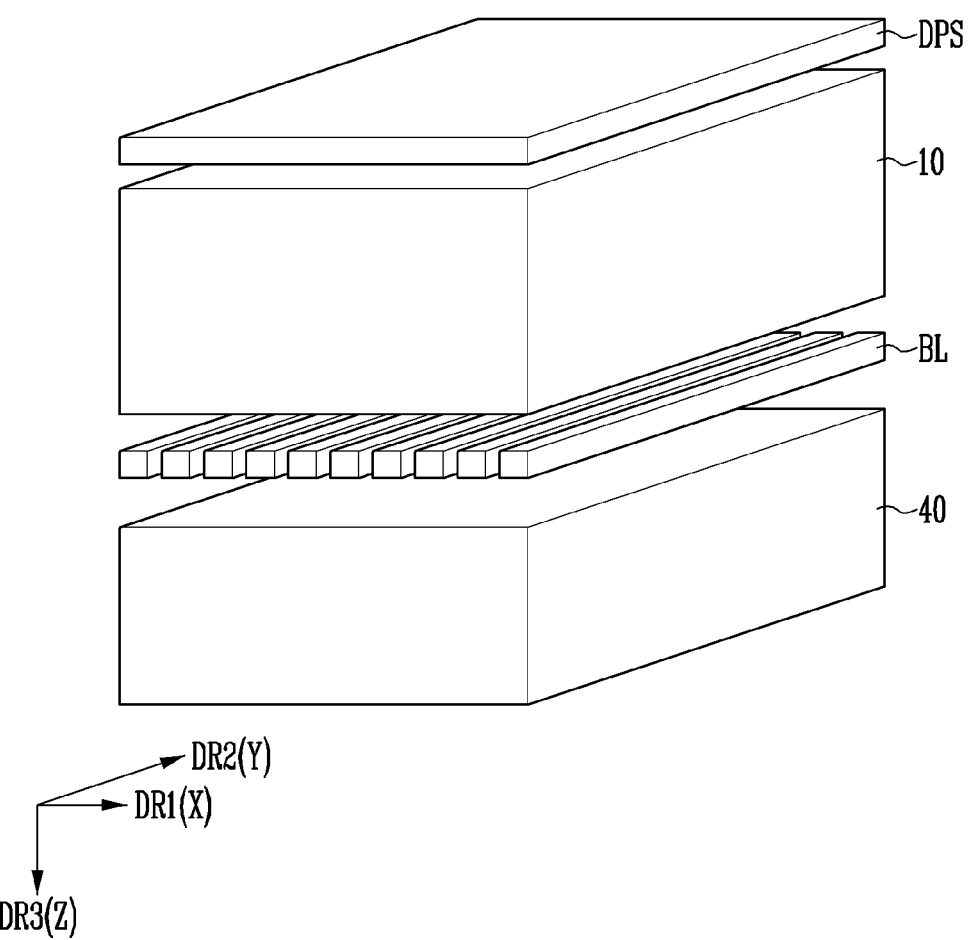

FIGS. 3A and 3B are views illustrating vertical arrangements of a semiconductor memory device in accordance with embodiments of the present disclosure.

Referring to FIGS. 3A and 3B, the semiconductor memory device may include a doped semiconductor structure DPS, a memory cell array 10, and a plurality of bit lines BL. The doped semiconductor structure DPS may have a flat plate shape extending in a first direction DR1 and a second direction DR2. The plurality of bit lines BL may be disposed at a position spaced apart from the doped semiconductor structure DPS in a third direction DR3. In an embodiment, the first direction DR1, the second direction DR2, and the third direction DR3 may respectively correspond to X-axis, Y-axis, and Z-axis directions. The doped semiconductor structure DPS may be connected to the common source line CSL shown in FIG. 2. The memory cell array 10 may be disposed between the plurality of bit lines BL and the doped semiconductor structure DPS.

Referring to FIG. 3A, a peripheral circuit structure 40 of the semiconductor memory device may be adjacent to the doped semiconductor structure DPS. Although not shown in the drawing, a plurality of interconnections may be disposed between the peripheral circuit structure 40 and the doped semiconductor structure DPS, or a plurality of interconnections and a plurality of conductive bonding pads may be disposed between the peripheral circuit structure 40 and the doped semiconductor structure DPS.

Referring to FIG. 3B, the peripheral circuit structure 40 of the semiconductor memory device may be adjacent to the plurality of bit lines BL. Although not shown in the drawing, a plurality of interconnections may be disposed between the peripheral circuit structure 40 and the plurality of bit lines BL, or a plurality of interconnections and a plurality of conductive bonding pads may be disposed between the peripheral circuit structure 40 and the plurality of bit lines BL.

Referring to FIGS. 3A and 3B, the doped semiconductor structure DPS, the memory cell array 10, and the plurality of bit lines BL may overlap with the peripheral circuit structure 40.

In an embodiment, processes for forming the doped semiconductor structure DPS, the memory cell array 10, and the plurality of bit lines BL may be performed on a first structure including the peripheral circuit structure 40. In another embodiment, a process for forming the first structure including the peripheral circuit structure 40 and a process for forming a second structure including the memory cell array 10 and the plurality of bit lines BL may be individually performed. The first structure and the second structure may be bonded to each other through a plurality of conductive bonding pads. The doped semiconductor structure DPS may be provided while the second structure is formed, or be provided through a separate process after the first structure and the second structure are bonded to each other.

Hereinafter, the embodiments of the memory cell array shown in FIGS. 3A and 3B will be described in more detail. Hereinafter, the embodiments of the present disclosure will be described based on a structure in which memory cell string groups connected to the same bit line are connected to drain select lines isolated from each other as shown in FIG. 2. However, the embodiments of the present disclosure are not limited thereto.

Figure 4:
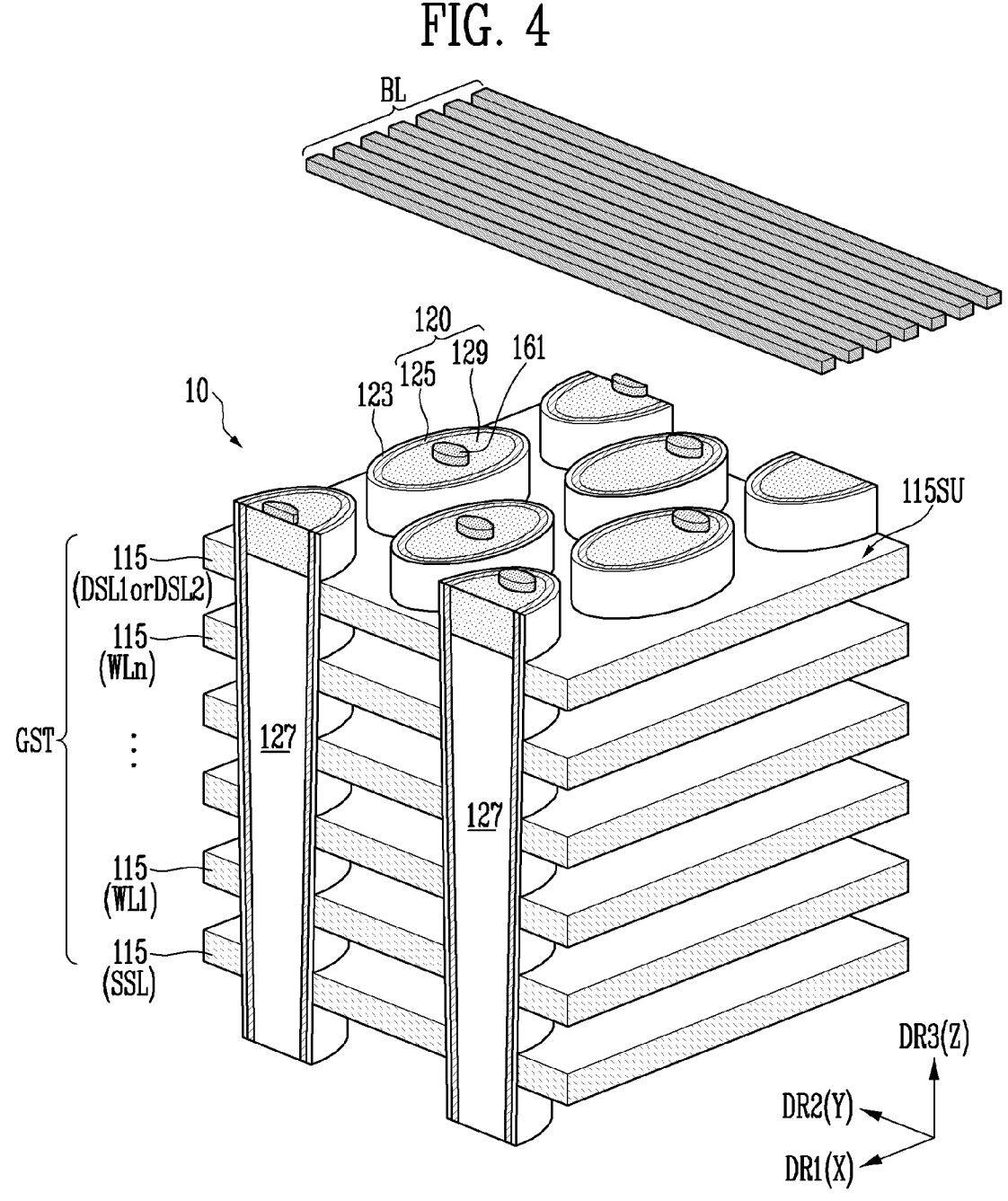
FIG. 4 is a perspective view illustrating a semiconductor memory device in accordance with an embodiment of the present disclosure.

FIG. 4 is a perspective view illustrating a semiconductor memory device in accordance with an embodiment of the present disclosure. For convenience of description, illustration of some components in FIG. 4 is omitted.

Referring to FIG. 4, a memory cell array 10 of the semiconductor memory device may be provided as a three-dimensional memory cell array. To this end, the memory cell array 10 may include a gate stack structure GST including a plurality of conductive layers 115, a plurality of channel structures 120 inside the gate stack structure GST, and a plurality of memory layers 123 between the plurality of channel structures 120 and the gate stack structure GST.

Each conductive layer 115 may include a surface 115SU extending along a first direction DR1 and a second direction DR2. The plurality of conductive layers 115 may be stacked to be spaced apart from each other in a third direction DR3 intersecting surfaces 115SU thereof. The first direction DR1, the second direction DR2, and the third direction DR3 may be defined as the same directions as shown in FIGS. 3A and 3B.

The plurality of conductive layers 115 may be provided as at least one source select line SSL, a plurality of word lines WL1 to WLn, and at least one drain select line DSL1 or DSL2, which are shown in FIG. 2. Each conductive layer 115 may include at least one of a doped semiconductor layer, a metal layer, and a conductive metal nitride layer. The doped semiconductor layer may include a doped silicon layer. The metal layer may include tungsten, copper, molybdenum, and the like. The conductive metal nitride layer may include a titanium nitride layer, a tantalum nitride layer, and the like.

The plurality of channel structures 120 may extend in the third direction to penetrate the plurality of conductive layers 115. The channel structure 120 may have a cross-sectional structure including a major axis and a minor axis. In an embodiment, a cross-sectional surface of each channel structure 120 may have substantially an elliptical shape.

Each channel structure 120 may include a channel layer 125 which provides a channel region of a memory cell string. The channel layer 125 may be formed of a semiconductor material such as silicon or germanium. The channel layer 125 may be formed in a tubular shape. The channel structure 120 may further include a capping layer 129 disposed in a central region of the tubular channel layer 125. The capping layer 129 may be disposed on a core insulating layer 127 disposed at a portion of the central region of the tubular channel layer 125, and be surrounded by an end portion of the channel layer 125. The capping layer 129 may be formed of a doped semiconductor layer. The doped semiconductor layer of the capping layer 129 may include at least one of an n-type impurity and a p-type impurity. In an embodiment, the doped semiconductor layer of the capping layer 129 may include an n-type impurity as a majority carrier. The channel layer 125 may extend to surround a sidewall of the capping layer 129 and a sidewall of the core insulating layer 127, and the end portion of the channel layer 125, which is adjacent to the capping layer 129, may be doped with the same impurity as the capping layer 129.

The memory layer 123 may be interposed between each of the plurality of conductive layers 115 and the channel structure 120. In an embodiment, the memory layer 123 may extend along a sidewall of the channel structure 120. Each channel structure 120 and a memory layer 123 corresponding thereto may form a cell plug. Each cell plug may correspond to a memory cell string.

The memory cell array 10 may be connected to a plurality of bit lines BL through a plurality of conductive contact structures 161. The plurality of conductive contact structures 161 may be formed of a conductive material, and respectively correspond to the plurality of channel structures 120.

Figure 6:
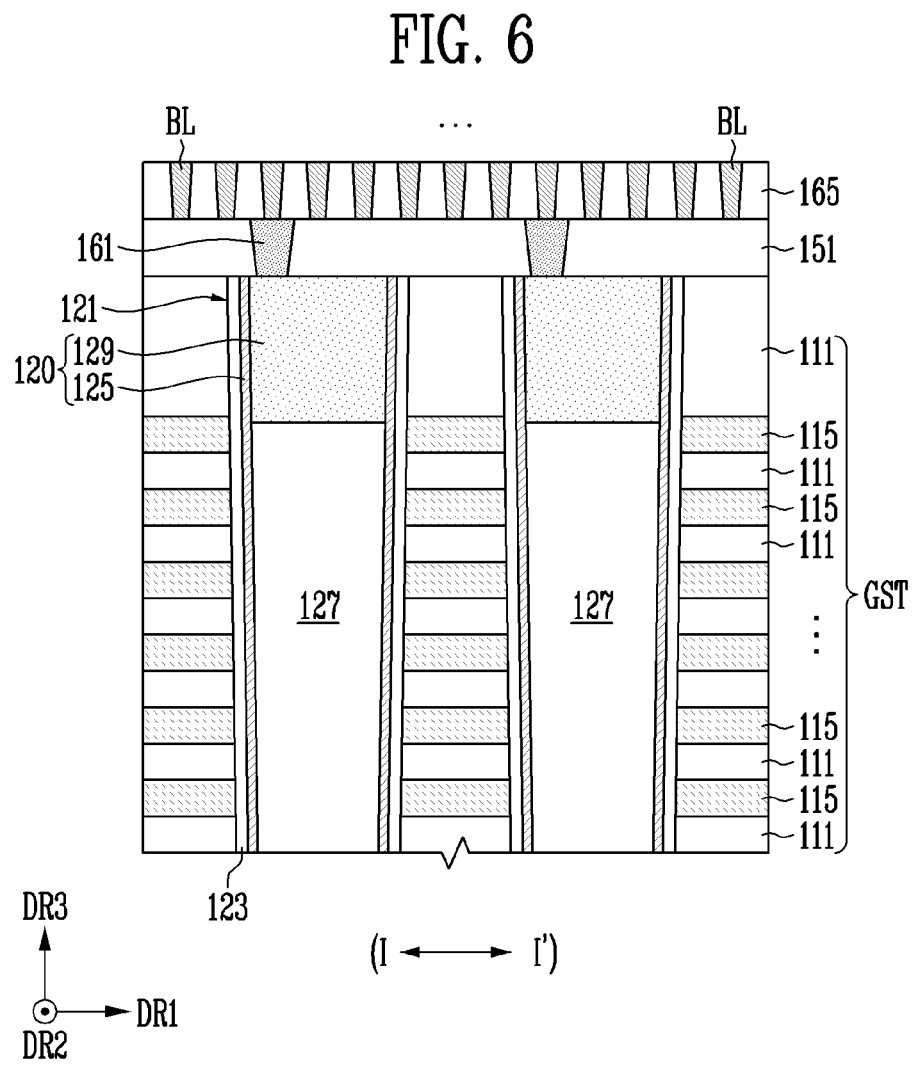

The plurality of bit lines BL may be disposed above the gate stack structure GST. More specifically, the plurality of bit lines BL may be spaced apart from the gate stack structure GST. FIG. 4 illustrates an exploded perspective view with respect to the plurality of bit lines BL. The plurality of bit lines BL may be arranged to be in contact with the plurality of conductive contact structures 161 as shown in FIG. 6, and be respectively connected to the plurality of channel structures 120 via the plurality of conductive contact structures 161 as shown in FIG. 6.

The plurality of bit lines BL may extend in a direction intersecting major axes of the plurality of channel structures 120, and be arranged to be spaced apart from each other in a direction in which the major axes of the plurality of channel structures 120 face. In an embodiment, the major axes of the plurality of channel structures 120 may face in the first direction DR1, and minor axes of the plurality of channel structures 120 may face in the second direction DR2. The plurality of bit lines BL may be arranged to be spaced apart from each other in the first direction DR1, and extend in the second direction DR2.

The positions of the plurality of conductive contact structures 161 may be controlled such that each channel structure 120 is controlled by a bit line corresponding thereto among the plurality of bit lines and is independent from an operation of the other bit lines. For example, although two or more bit lines BL overlap with the one channel structure 120 on the one channel structure 120, the alignment position of a conductive contact structure 161 corresponding to the one channel structure 120 may be controlled on the one channel structure such that the conductive contact structure 161 is connected to one of the two or more bit lines BL. As described above, when the plurality of bit lines BL are disposed to be spaced apart from each other in the direction in which the major axis of the channel structure faces, an alignment margin of the conductive contact structure 161 for connecting the channel structure 120 to a bit line BL corresponding thereto may be secured even when two or more bit lines BL overlaps with one channel structure 120 on the one channel structure 120.

At least one conductive layer adjacent to the plurality of bit lines BL among the plurality of conductive layers 115 may be provided as the drain select line DSL1 or DSL2, and the others among the plurality of conductive layers 115 may be provided as the source select line SSL and the plurality of word lines WL1 to WLn. Intermediate conductive layers between the conductive layer provided as the drain select line DSL1 or DSL2 and the conductive layer provided as the source select line SSL may be used as the plurality of word lines WL1 to WLn.

Figure 5A:
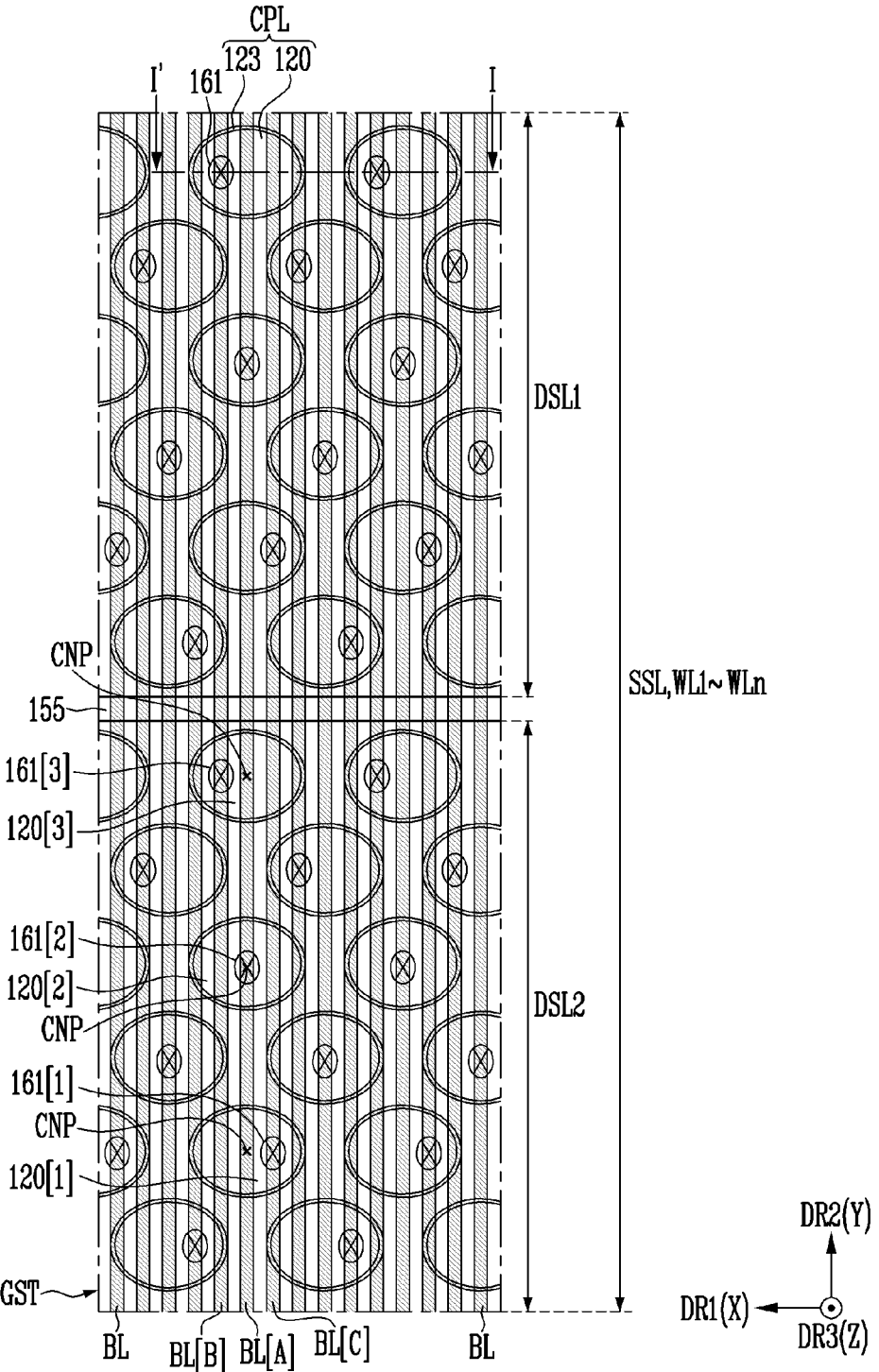
FIG. 5A is a plan view an arrangement of a gate stack structure, a plurality of cell plugs, a plurality of conductive contact structures, and a plurality of bit lines of a semiconductor memory device in accordance with an embodiment of the present disclosure.

FIG. 5A is a plan view an arrangement of a gate stack structure, a plurality of cell plugs, a plurality of conductive contact structures, and a plurality of bit lines of a semiconductor memory device in accordance with an embodiment of the present disclosure.

Referring to FIG. 5A, a gate stack structure GST may include a source select line SSL, a first drain select line DSL1, a second drain select line DSL2, and a plurality of word lines WL1 to WLn. A conductive layer for each of the source select line SSL, the first drain select line DSL1, the second drain select line DSL2, and the plurality of word lines WL1 to WLn may extend in the first direction DR1 and the second direction DR2 as described with reference to FIG. 4. As shown in FIG. 4, the plurality of word lines WL1 to WLn may be spaced apart from the source select line SSL in the third direction DR3. As shown in FIG. 4, the first drain select line DSL1 and the second drain select line DSL2 may be spaced apart from the plurality of word lines WL1 to WLn in the third direction DR3. The first drain select line DSL1, and the second drain select line DSL2 may be isolated from each other by an insulating structure 155 on the same plane (e.g., an XY plane). The first drain select line DSL1, and the second drain select line DSL2 may be spaced apart from each other in the second direction DR2 as an extending direction of a plurality of bit lines BL by the insulating structure 155.

A plurality of cell plugs CPL may be disposed inside the gate stack structure GST. The plurality of cell plugs CPL may extend in the third direction DR3 to penetrate the source select line SSL, the plurality of word lines WL1 to WLn, the first drain select line DSL1, and the second drain select line DSL2. The plurality of cell plugs CPL may be divided into a first cell plug group penetrating the first drain select line DSL1 and a second cell plug group penetrating the second drain select line DSL2. Each of the source select line SSL and the plurality of word lines WL1 to WLn may continuously extend in the second direction DR2 to surround cell plugs CPL of the first cell plug group and cell plugs CPL of the second cell plug group. Accordingly, each of the source select line SSL and the plurality of word lines WL1 to WLn may include a first memory cell array region overlapping with the first drain select line DSL1, a second memory cell array region overlapping with the second drain select line DSL2, and a connection region overlapping the insulating structure 155. The first memory cell array region and the second memory cell region of each of the source select line SSL and the plurality of word lines WL1 to WLn may be connected to each other by the connection region.

Each cell plug CPL may include a channel structure 120 inside the gate stack structure GST and a memory layer 123 between the channel structure 120 and the gate stack structure GST as described with reference to FIG. 4. A plurality of channel structures 120 of each of the first cell plug group and the second cell plug group may be regularly arranged in the first direction DR1 and the second direction DR2. In an embodiment, the plurality of channel structures 120 may be arranged in a zigzag pattern to increase an arrangement density.

Figure 5B:
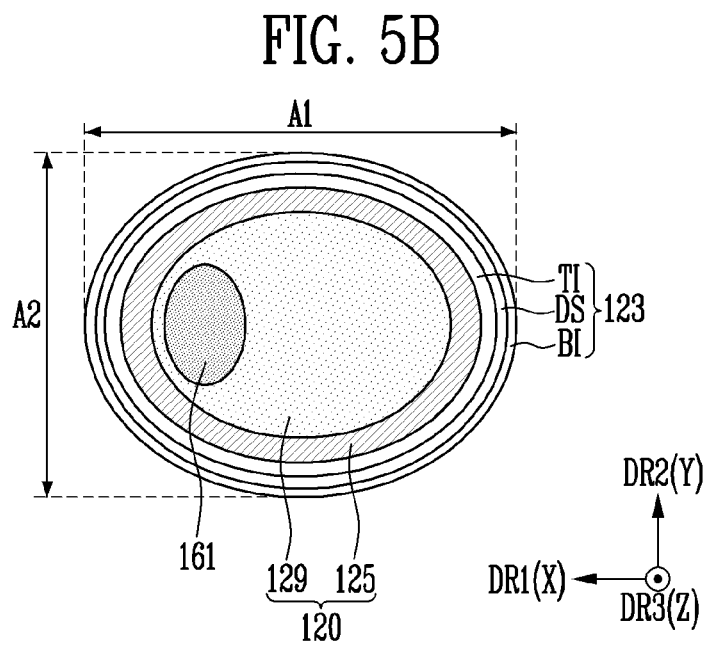

FIG. 5B is an enlarged view of a cell plug shown in FIG. 5A.

Referring to FIGS. 5A and 5B, each cell plug CPL may have a cross-sectional structure including a major axis A1 facing in the first direction DR1 as an arrangement direction of the plurality of bit lines BL and a minor axis A2 facing in the second direction DR2 as an extending direction of the plurality of bit lines BL.

The channel structure 120 of the cell plug CPL may also have a cross-sectional structure including a major axis facing in the first direction DR1 and a minor axis facing in the second direction DR2, corresponding to the cross-sectional structure of the cell plug CPL. In an embodiment, a cross-sectional surface of the channel structure 120 may have substantially an elliptical shape. The channel structure 120 may include a channel layer 125 and a capping layer 129 as described with reference to FIG. 4.

The memory layer 123 may include a tunnel insulating layer TI, a data storage layer DS, and a blocking insulating layer BI. The tunnel insulating layer TI may extend to surround a sidewall of the channel structure 120. The data storage layer DS may extend to surround a sidewall of the tunnel insulating layer TI. The blocking insulating layer BI may extend to surround a sidewall of the data storage layer DS. The data storage layer DS may be formed of a material layer capable of storing data changed using Fowler-Nordheim tunneling. In an embodiment, the data storage layer DS may be formed of a nitride layer in which charges can be trapped. However, the embodiment of the present disclosure is not limited thereto, and the data storage layer DS may include a nano dot, a variable resistance layer, and the like. The blocking insulating layer BI may include oxide capable of blocking charges, and the tunnel insulating layer TI may include silicon oxide through which charges can tunnel.

The plurality of bit lines BL may be arranged to be spaced apart from each other in the first direction DR1, and be spaced apart from the plurality of channel structures 120 in the third direction DR3. Two or more bit lines BL may overlap with each channel structure 120. In accordance with the embodiment of the present disclosure, because a major axis of each channel structure 120 faces in the arrangement direction of the bit lines BL, the arrangement distance between the bit lines BL overlapping with the channel structure 120 and the width of each bit line BL may be widely secured even when the number of bit lines BL overlapping with the channel structure 120 is increased. In an embodiment, when the number of rows of channel structures 120 controlled by the drain select line DSL1 or DSL2 is increased, the number of insulating structures 155 for partitioning the drain select lines may be decreased, and thus the planar area allocated to the insulating structure 155 may be reduced.

Because of characteristics of an etching process performed in the third direction DR3 in a process of manufacturing the semiconductor memory device, in an embodiment, a planar area for a margin of the etching process may be increased in proportion to a stacked number of the word lines WL1 to WLn. As described above, in accordance with the embodiments of the present disclosure, the degree of integration of memory cells may be improved even when the stacked number of the word lines WL1 to WLn is not increased. Thus, in an embodiment, the degree of integration of memory cells may be improved without increasing the planar area for the margin of the etching process.

A plurality of conductive contact structures 161 may be disposed between the plurality of bit lines BL and the plurality of channel structures 120. The plurality of conductive contact structures 161 may correspond to the plurality of channel structures 120. Each conductive contact structure 161 may connect a channel structure 120 corresponding thereto to one of two or more bit lines BL overlapping the channel structure 120. To this end, the positions of the plurality of conductive contact structure 161 may be variously controlled according to an arrangement of the plurality of channel structures 120 and an arrangement of the plurality of bit lines BL.

Referring to FIG. 5A, the plurality of channel structures 120 of each of the first cell plug group and the second cell plug group may include a first channel structure 120[1], a second channel structure 120[2], and a third channel structure 120[3]. The first channel structure 120[1], the second channel structure 120[2], and the third channel structure 120[3] may be arranged in a line along the second direction DR2. The plurality of bit lines BL may include a first bit line BL[A], a second bit line BL[B], and a third bit line BL[C], which extend in the second direction DR2 to overlap with each of the first to third channel structures 120[1] to 120[3]. The first bit line BL[A], the second bit line BL[B], and the third bit line BL[C] may be spaced apart from each other in the first direction DR1. Central points CNP of the respective first to third channel structures 120[1] to 120[3] may be aligned in a line along the first bit line BL[A]. The first bit line BL[A] may be arranged between the second bit line BL[B] and the third bit line BL[C].

The plurality of conductive contact structure 161 may include a first conductive contact structure 161[1] between the first channel structure 120[1] and the third bit line BL[C], a second conductive contact structure 161[2] between the second channel structure 120[2] and the first bit line BL[A], and a third conductive contact structure 161[3] between the third channel structure 120[3] and the second bit line BL[B]. The first to third conductive contact structures 161[1] to 161[3] may be aligned at positions spaced apart from each other in the first direction DR1 and the second direction DR2 such that different bit lines can be connected to the first to third channel structures 120[1] to 120[3]. More specifically, the first conductive contact structure 161[1] may overlap with the first channel structure 120[1] at a position biased in a direction opposite to the first direction DR1 with respect to the central point CNP of the first channel structure 120[1]. The second conductive contact structure 161[2] may overlap with the central point CNP of the second channel structure 120[2]. The third conductive contact structure 161[3] may overlap with the third channel structure 120[3] at a position biased in the first direction DR1 with respect to the central point CNP of the third channel structure 120[3]. In accordance with the embodiment of the present disclosure, because the main axis of each channel structure 120 faces in the arrangement direction of the bit lines BL, an alignment margin of the conductive contact structure 161 may be secured even when the conductive contact structure 161 is disposed being biased to one side in the arrangement direction of the bit lines BL with respect to the central point CNP of the channel structure 120.

FIG. 6 illustrates a section of the semiconductor memory device taken along line I-I' shown in FIG. 5A.

Referring to FIGS. 5A and 6, the gate stack structure GST may include a plurality of conductive layers 115 for the source select line SSL, the plurality of word lines WL1 to WLn, the first drain select line DSL1, and the second drain select line DSL2. Also, the gate stack structure GST may further include interlayer insulating layers 111 alternately disposed with the plurality of conductive layers 115 in the third direction DR3. The gate stack structure GST may include a plurality of channel holes 121 penetrating the plurality of conductive layers 115 and the plurality of interlayer insulating layers 111.

The memory layer 123 may extend along a sidewall of a channel hole 121 corresponding thereto. The channel layer 125 of the channel structure 120 may extend along an inner wall of the memory layer 123 in the channel hole 121. A central region of the channel hole 121, which is opened by the channel layer 125 of the channel structure 120, may be filled with a core insulating layer 127 and a capping layer 129.

The plurality of bit lines BL may be formed in an upper insulating layer 165 over the gate stack structure GST. An interposition insulating layer 151 may be disposed between the upper insulating layer 165 and the gate stack structure GST.

The interposition insulating layer 151 may be disposed on the gate stack structure GST, and extend to cover the plurality of channel structures 120. The interposition insulating layer 151 may be penetrated by the plurality of conductive contact structures 161. The interposition insulating layer 151 may insulate some of the plurality of channel structures 120 from some of the plurality of bit lines BL, and each conductive contact structure 161 may connect a bit line BL corresponding thereto and a channel structure 120 corresponding thereto to each other. In an embodiment, the first bit line BL[A] among the first to third bit lines BL[A] to BL[C] may be connected to the second channel structure 120[2] by the second conductive contact structure 161[2], and the second bit line BL[B] and the third bit line BL[C] may be insulated from the second channel structure 120[2] by the interposition insulating layer 151.

Figure 7A:
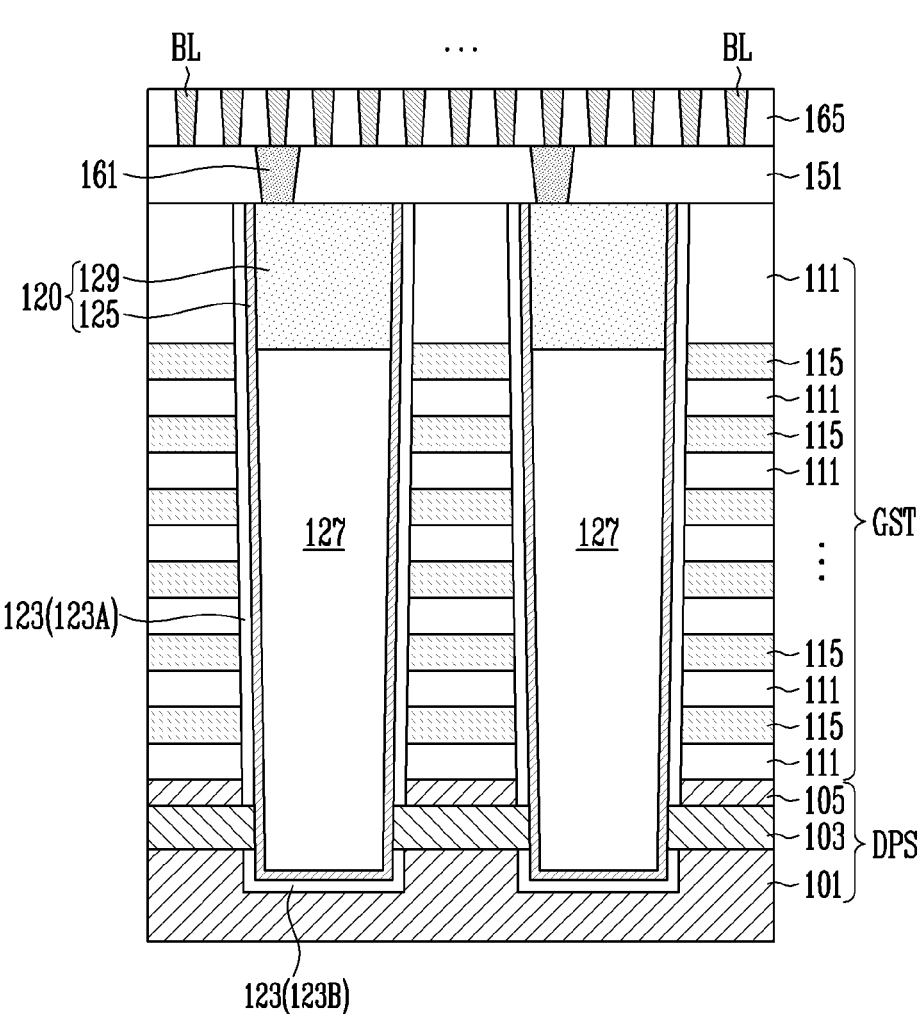
FIGS. 7A, 7B, and 7C are sectional views illustrating a connection structure between a doped semiconductor structure and a channel structure in accordance with embodiments of the present disclosure.
Figure 7B:
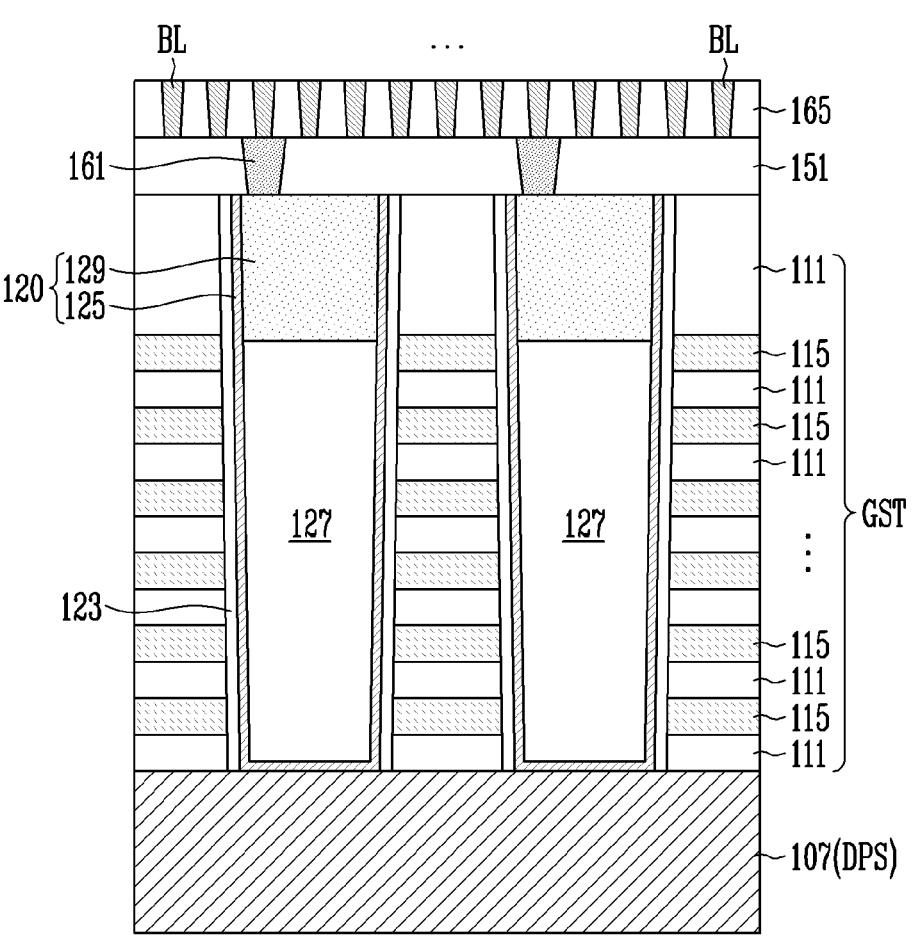
Figure 7C:
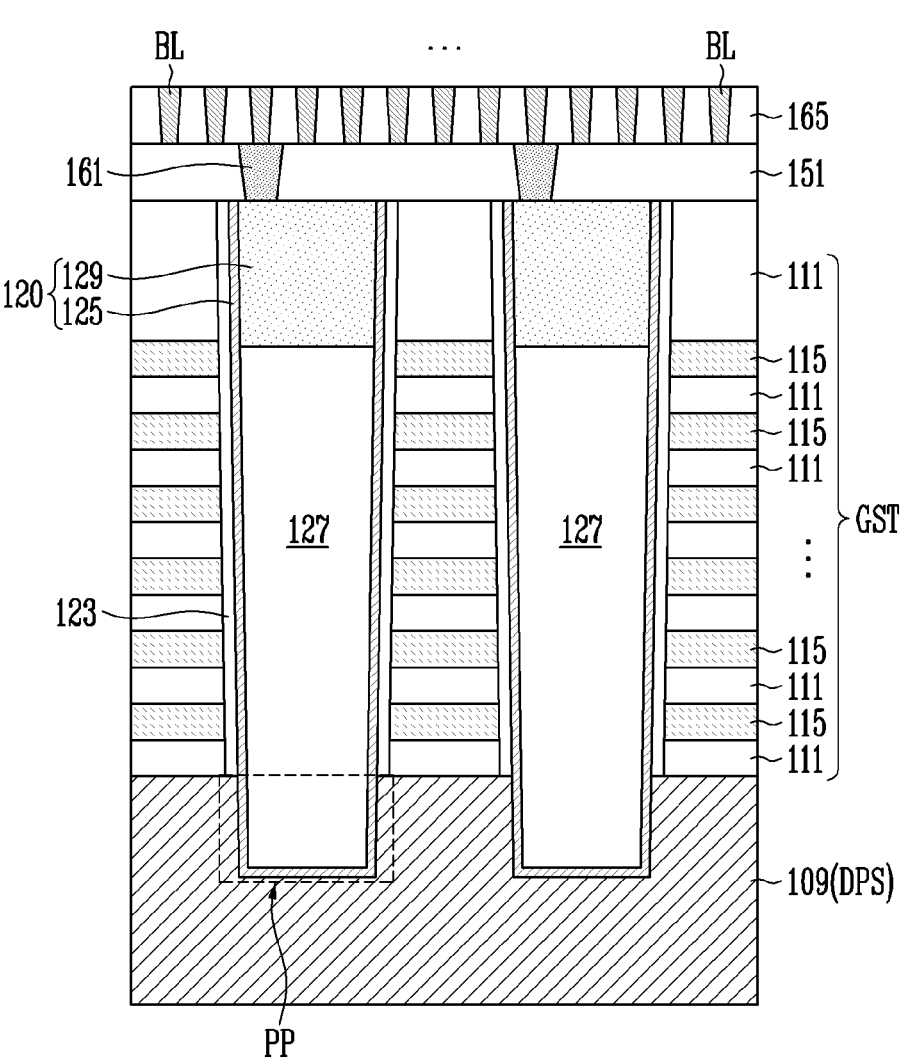

FIGS. 7A, 7B, and 7C are sectional views illustrating a connection structure between a doped semiconductor structure and a channel structure in accordance with embodiments of the present disclosure. Hereinafter, overlapping descriptions of components identical to the components shown in FIGS. 5A and 6 will be omitted.

Referring to FIGS. 7A to 7C, a semiconductor memory device may include a gate stack structure GST of a plurality of interlayer insulating layers 111 and a plurality of conductive layers 115, a core insulating layer 127 and a channel structure 120 inside the gate stack structure GST, a conductive contact structure 161 inside an interposition insulating layer 151, a bit line BL inside an upper insulating layer 165, and a doped semiconductor structure DPS.

The doped semiconductor structure DPS may include at least one doped semiconductor layer including at least one of an n-type impurity and a p-type impurity. In an embodiment, the doped semiconductor structure DPS may include, as a majority carrier, an impurity of the same conductivity as a capping layer 129 of the channel structure 120. In another embodiment, the doped semiconductor structure DPS may include a region having an n-type impurity as a majority carrier and a region having a p-type impurity as a majority carrier.

The doped semiconductor structure DPS may be in contact with a channel layer 125 of the channel structure 120, and be spaced apart from the capping layer 129 of the channel structure 120 with the core insulating layer 127 interposed therebetween. The connection structure between the doped semiconductor structure DPS and the channel structure 120 may be various.

Referring to FIG. 7A, the doped semiconductor structure DPS may include two or more semiconductor layers. In an embodiment, the doped semiconductor structure DPS may include a first semiconductor layer 101, a second semiconductor layer 103 on the first semiconductor layer 101, and a third semiconductor layer 105 on the second semiconductor layer 103.

The channel layer 125 may penetrate the third semiconductor layer 105, and extend to the inside of the first semiconductor layer 101. The second semiconductor layer 103 may be in contact with a portion of a sidewall of the channel layer 125, and extend between the first semiconductor layer 101 and the third semiconductor layer 105.

A memory layer 123 may be isolated into a first memory pattern 123A and a second memory pattern 123B by the second semiconductor layer 103. The first memory pattern 123A may extend between the channel layer 125 and the third semiconductor layer 105 and between the channel layer 125 and the gate stack structure GST. The second memory pattern 123B may be interposed between the channel layer 125 and the first semiconductor layer 101.

Referring to FIG. 7B, the doped semiconductor structure DPS may include a single semiconductor layer 107. The semiconductor layer 107 may be a single crystalline semiconductor layer or a multi-crystalline semiconductor layer.

The channel layer 125 may be in contact with the doped semiconductor structure DPS while penetrating the memory layer 123. The channel layer 125 may extend between the doped semiconductor structure DPS and the core insulating layer 127, and include a closed end portion facing the doped semiconductor structure DPS. The channel layer 125 may include a bottom surface in contact with the doped semiconductor structure DPS.

Although not shown in the drawing, in another embodiment, an epitaxial semiconductor layer may be disposed between the channel layer 125 and the semiconductor layer 107 of the doped semiconductor structure DPS.

Referring to FIG. 7C, the channel layer 125 may include a protrusion part PP protruding toward the doped semiconductor structure DPS as compared with the memory layer 123. The doped semiconductor structure DPS may include a semiconductor layer 109 in contact with a surface of the protrusion part PP of the channel layer 125.

Figure 8A:
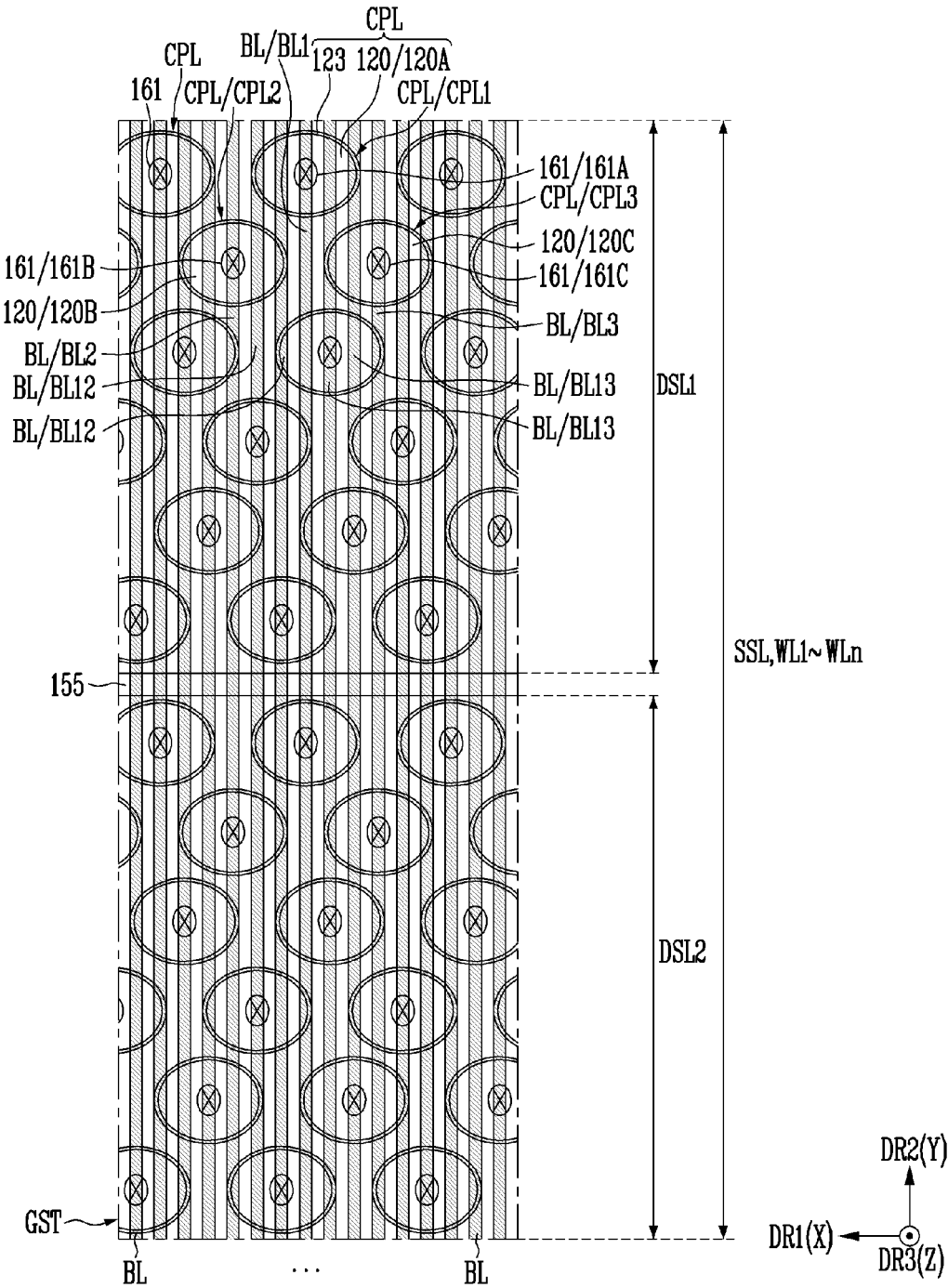
FIG. 8A is a plan view illustrating an arrangement of a gate stack structure, a plurality of cell plugs, a plurality of conductive contact structures and a plurality of bit lines of a semiconductor memory device in accordance with an embodiment of the present disclosure.

FIG. 8A is a plan view illustrating an arrangement of a gate stack structure, a plurality of cell plugs, a plurality of conductive contact structures, and a plurality of bit lines of a semiconductor memory device in accordance with an embodiment of the present disclosure.

Referring to FIG. 8A, a gate stack structure GST may include a source select line SSL, a first drain select line DSL1, a second drain select line DSL2, and a plurality of word lines WL1 to WLn as described with reference to FIG. 5A. The first drain select line DSL1 and the second drain select line DSL2 may be isolated from each other by an insulating structure 155 as described with reference to FIG. 5A. The first drain select line DSL1 and the second drain select line DSL2 may be spaced apart from each other in the second direction DR2 as an extending direction of a plurality of bit lines BL as described with reference to FIG. 5A. Hereinafter, overlapping descriptions of components identical to the components shown in FIG. 5A will be omitted.

A plurality of cell plugs CPL may be disposed inside the gate stack structure GST. Each cell plug CPL may include a channel structure 120 inside the gate stack structure GST and a memory layer 123 between the channel structure 120 and the gate stack structure GST as described with reference to FIG. 4. As described with reference to FIG. 5A, the plurality of cell plugs CPL may be divided into a first cell plug group penetrating the first drain select line DSL1 and a second cell plug group penetrating the second drain select line DSL2. Cell plugs CPL of each of the first cell plug group and the second cell plug group may be divided into a plurality of sub-plug groups. Each sub-plug group may include a first cell plug CPL1, a second cell plug CPL2, and a third cell plug CPL3, which are arranged substantially at apexes of a triangle.

Figure 8B:
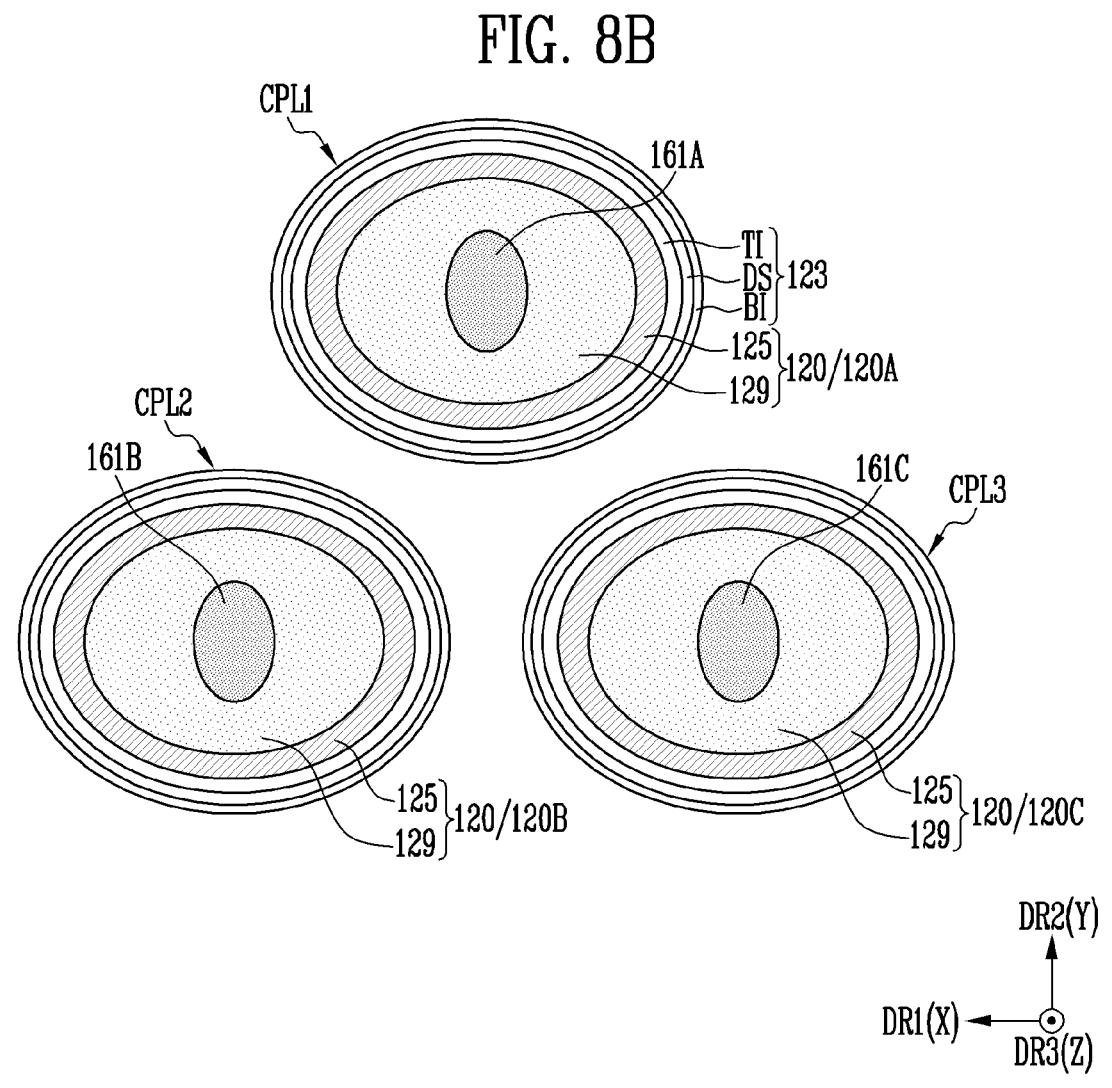

FIG. 8B is an enlarged view of the first cell plug CPL1, the second cell plug CPL2, and the third cell plug CPL3, which are shown in FIG. 8A.

Referring to FIGS. 8A and 8B, a plurality of channel structures 120 may include a first channel structure 120A of the first cell plug CPL1, a second channel structure 120B of the second cell plug CPL2, and a third channel structure 120C of the third cell plug CPL3. The first to third channel structures 120A to 120C may be arranged substantially at apexes of a triangle according to an arrangement rule of the first to third cell plugs CPL1 to CPL3. More specifically, the second channel structure 120B and the third channel structure 120C may be arranged in a line in the first direction DR1 as an arrangement direction of the bit lines BL, and the first channel structure 120A may be spaced apart from the second channel structure 120B and the third channel structure 120C in the second direction DR2 as an extending direction of the bit lines BL.

As described with reference to FIGS. 5A and 5B, each channel structure 120 may have a cross-sectional structure including a major axis facing in the first direction DR1 as the arrangement direction of the plurality of bit lines BL and a minor axis facing in the second direction DR2 as the extending direction of the plurality of bit lines BL. In an embodiment, a cross-sectional surface of each channel structure 120 may have substantially an elliptical shape. As described with reference to FIG. 4, the channel structure 120 may include a channel layer 125 and a capping layer 129, and be surrounded by the memory layer 123. The memory layer 123 may include a tunnel insulating layer TI, a data storage layer DS, and a blocking insulating layer BI as described with reference to FIGS. 5A and 5B.

The plurality of bit lines BL may be arranged to be spaced apart from each other in the first direction DR1, and be spaced apart from the plurality of channel structures 120 in the third direction DR3.

The plurality of bit lines BL may be respectively connected to the plurality of channel structures 120 through a plurality of conductive contact structures 161. The plurality of conductive contact structures 161 may be arranged according to an arrangement of the plurality of bit lines BL, and respectively overlap with central points of the plurality of channel structures 120. The arrangement of the plurality of channel structures 120 may be controlled such that the plurality of conductive contact structures 161 can overlap with the central points of the plurality of channel structures 120. To this end, the positions of the plurality of channel structures 120 may be controlled for each channel group including the first channel structure 120A, the second channel structure 120B, and the third channel structure 120C, which are arranged substantially at the apexes of the triangle. The arrangement of the plurality of channel structures 120 is controlled such that the plurality of conductive contact structure 161 can be aligned at the central points of the plurality of channel structures 120. Accordingly, in an embodiment, an alignment defect of the plurality of conductive contact structures 161 may be reduced.

The plurality of conductive contact structures 161 may include a first conductive contact structure 161A aligned at a central point of the first channel structure 120A, a second conductive contact structure 161B aligned at a central point of the second channel structure 120B, and a third conductive contact structure 161C aligned at a central point of the third channel structure 120C. The first to third conductive contact structures 161A to 161C may be arranged substantially at apexes of a triangle according to an arrangement of the first to third channel structures 120A to 120C.

Referring to FIG. 8A, three or more of the plurality of bit lines BL may overlap with a channel structure 120 corresponding thereto. In an embodiment, the plurality of bit lines BL may include a first bit line BL1 overlapping with the central point of the first channel structure 120A, a second bit line BL2 overlapping with the central point of the second channel structure 120B, and a third bit line BL3 overlapping with the central point of the third channel structure 120C, at least one fourth bit line BL12 between the first bit line BL1 and the second bit line BL2, and at least one fifth bit line BL13 between the first bit line BL1 and the third bit line BL3. The first bit line BL1 may extend to overlap with a position spaced apart from the second channel structure 120B and the third channel structure 120C between the second channel structure 120B and the third channel structure 120C. The second bit line BL2 may be disposed at a position spaced apart from the first channel structure 120A in the first direction DR1, and the first channel structure 120A may be disposed at a position spaced apart from the third bit line BL3 in the first direction DR1. The fourth bit line BL12 may extend in the second direction DR2 to overlap with the first channel structure 120A and the second channel structure 120B. The fifth bit line BL13 may extend in the second direction DR2 to overlap with the first channel structure 120A and the third channel structure 120C.

The first conductive contact structure 161A may be disposed between the first bit line BL1 and the first channel structure 120A, to connect the first channel structure 120A to the first bit line BL1. The second conductive contact structure 161B may be disposed between the second bit line BL2 and the second channel structure 120B, to connect the second channel structure 120B to the second bit line BL2. The third conductive contact structure 161C may be disposed between the third bit line BL3 and the third channel structure 120C, to connect the third channel structure 120C to the third bit line BL3.

As shown in FIG. 6, each bit line BL may be insulated from some of the plurality of channel structures 120 by the interposition insulating layer 151, and be connected to a channel structure corresponding thereto by a conductive contact structure corresponding thereto among the plurality of conductive contact structures 161. Referring to FIGS. 8A and 6, for example, the first bit line BL1 may be connected to the first channel structure 120A by the first conductive contact structure 161A, and the fourth bit line BL12 and the fifth bit line BL13 may be insulated from the first channel structure 120A by the interposition insulating layer 151.

Figure 9:
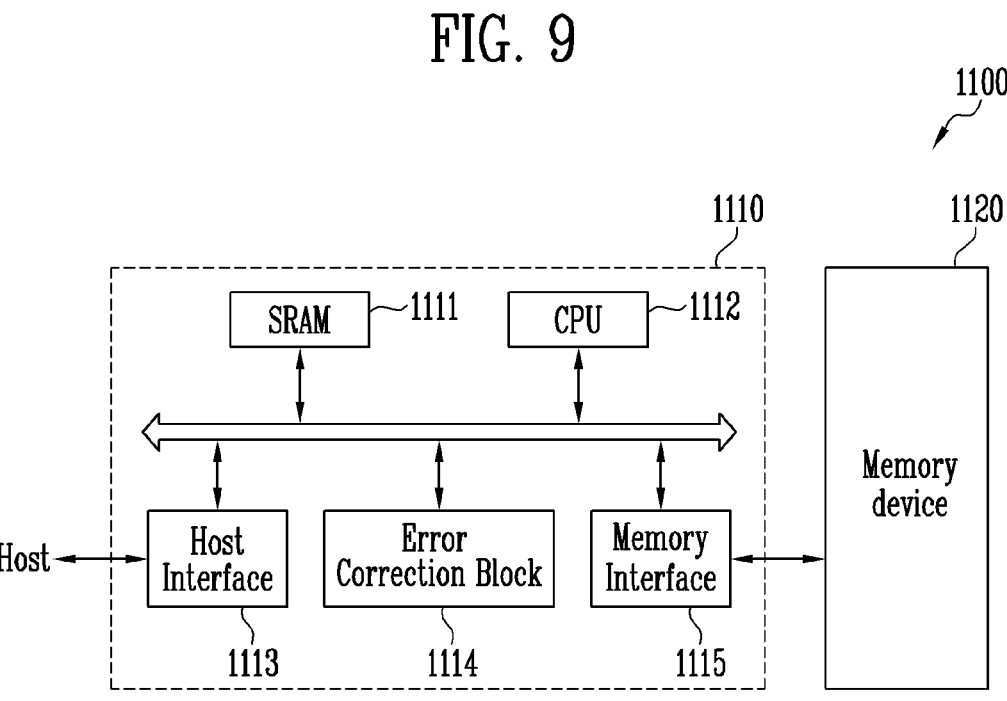
FIG. 9 is a block diagram illustrating a configuration of a memory system in accordance with an embodiment of the present disclosure.

FIG. 9 is a block diagram illustrating a configuration of a memory system in accordance with an embodiment of the present disclosure.

Referring to FIG. 9, the memory system 1100 includes a memory device 1120 and a memory controller 1110.

The memory device 1120 may be a multi-chip package configured with a plurality of flash memory chips. In an embodiment, the memory device 1120 may include a gate stack structure, a channel structure disposed inside the gate stack structure, the channel structure having a cross-sectional structure including a major axis and a minor axis, which face in directions intersecting each other, and two or more bit lines extending in a direction intersecting the major axis of the channel structure, the two or more bit lines being arranged to be spaced apart from each other in a direction in which the major axis of the channel structure faces.

The memory controller 1110 controls the memory device 1120, and may include Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects an error included in a data read from the memory device 1120 and corrects the detected error. The memory interface 1115 interfaces with the memory device 1120. The memory controller 1110 may further include Read Only Memory (ROM) for storing code data for interfacing with the host, and the like.

The memory system 1100 configured as described above may be a memory card or a Solid State Disk (SSD), in which the memory device 1120 is combined with the memory controller 1110. For example, when the memory system 1100 is an SSD, the memory controller 1110 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 10:
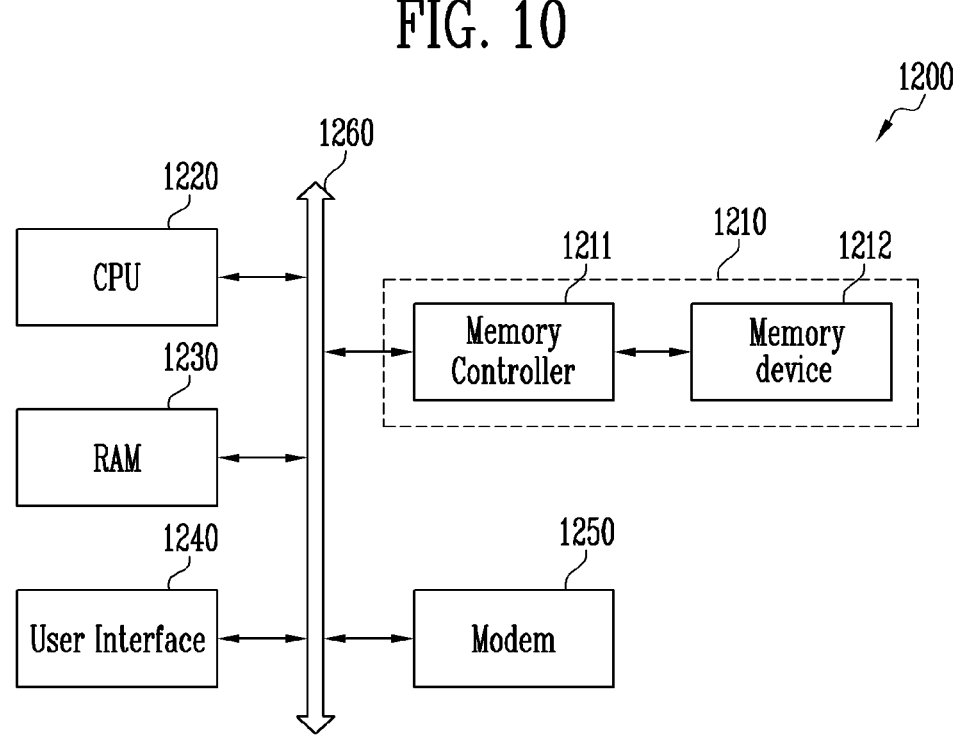
FIG. 10 is a block diagram illustrating a configuration of a computing system in accordance with an embodiment of the present disclosure.

FIG. 10 is a block diagram illustrating a configuration of a computing system in accordance with an embodiment of the present disclosure.

Referring to FIG. 10, the computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, mobile DRAM, and the like may be further included.

The memory system 1210 may be configured with a memory device 1212 and a memory controller 1211. The memory device 1212 may be configured identically to the memory device 1120 described above with reference to FIG. 9. The memory controller 1211 may be configured identically to the memory controller 1110 described above with reference to FIG. 9.

In accordance with various embodiments of the present disclosure, a channel structure is formed to have a cross-sectional structure including a major axis and a minor axis, which face in directions intersecting each other, so that the arrangement density of channel structures may be increased. Accordingly, in an embodiment, the degree of integration of the semiconductor memory device may be improved.

In accordance with various embodiments of the present disclosure, bit lines are disposed to be spaced apart from each other in a direction in which the major axis of the channel structure faces. Accordingly, in an embodiment, the arrangement distance between bit lines overlapping with one channel structure and the width of each bit line may be widely secured, and thus the stability of a manufacturing process may be improved.

What is claimed is:

1. A semiconductor memory device comprising:

a gate stack structure having a surface extending in a first direction and a second direction, which intersect each other, the gate stack structure including a plurality of conductive patterns disposed to be spaced apart from each other in a third direction intersecting the surface;

a channel structure disposed inside the gate stack structure, the channel structure having a cross-sectional structure including a major axis facing in the first direction and a minor axis facing in the second direction;

a memory layer between the channel structure and the gate stack structure;

two or more bit lines disposed above the gate stack structure, the two or more bit lines extending in a direction intersecting the major axis of the channel structure, the two or more bit lines being arranged to be spaced apart from each other in a direction in which the major axis of the channel structure faces; and a conductive contact structure connected between one of the two or more bit lines and the channel structure, wherein the two or more bit lines include a first bit line, a second bit line and a third bit line, and wherein the first to third bit lines overlap with the channel structure.

2. The semiconductor memory device of claim 1, wherein the cross-sectional structure of the channel structure has substantially an elliptical shape.

3. The semiconductor memory device of claim 1, wherein the channel structure overlaps with the two or more bit lines.

4. The semiconductor memory device of claim 1, wherein the first bit line includes a portion overlapping with a central point of the channel structure and is arranged between the second bit line and the third bit line.

5. The semiconductor memory device of claim 4, further comprising an interposition insulating layer disposed between the gate stack structure and the two or more bit lines, the interposition insulating layer being penetrated by the conductive contact structure, wherein the first bit line is connected to the channel structure by the conductive contact structure, and the second bit line and the third bit line are insulated from the channel structure by the interposition insulating layer.

6. The semiconductor memory device of claim 1, further comprising an interposition insulating layer disposed between the gate stack structure and the two or more bit lines, the interposition insulating layer being penetrated by the conductive contact structure, wherein the first bit line is connected to the channel structure by the conductive contact structure, and the second bit line is insulated from the channel structure by the interposition insulating layer.

7. A semiconductor memory device comprising:

a gate stack structure having a surface extending in a first direction and a second direction, which intersect each other, the gate stack structure including a plurality of conductive patterns disposed to be spaced apart from each other in a third direction intersecting the surface;

a plurality of channel structures disposed in the first direction and the second direction inside the gate stack structure, the plurality of channel structures having a cross-sectional structure including a major axis facing in the first direction and a minor axis facing in the second direction;

a plurality of memory layers between the plurality of channel structures and the gate stack structure;

a plurality of bit lines disposed above the gate stack structure, the plurality of bit lines being arranged to be spaced apart from each other in a direction in which the major axes of the plurality of channel structures face; and a plurality of conductive contact structures connecting the plurality of bit lines to the plurality of channel structures, wherein the plurality of channel structures include a first channel structure, wherein the plurality of bit lines include a first bit line, a second bit line and a third bit line, and wherein the first to third bit lines overlap with the first channel structure.

8. The semiconductor memory device of claim 7, wherein the cross-sectional structure of the plurality of channel structures has substantially an elliptical shape.

9. The semiconductor memory device of claim 7, wherein the plurality of channel structures are arranged in a zigzag pattern.

10. The semiconductor memory device of claim 7, wherein the plurality of channel structures further include a second channel structure and a third channel structure, which are arranged in a line in the second direction, wherein the plurality of bit lines further include a fourth bit line and a fifth bit line wherein the fourth bit line extends to overlap with the second channel structure, wherein the fifth bit line extends to overlap with the third channel structure, and wherein the first bit line is arranged between the fourth bit line and the fifth bit line.

11. The semiconductor memory device of claim 10, wherein the plurality of conductive contact structures include a first conductive contact structure between the first channel structure and the third bit line, a second conductive contact structure between the second channel structure and the first bit line, and a third conductive contact structure between the third channel structure and the second bit line, and wherein the first to third conductive contact structures are spaced apart from each other in the first direction and the second direction.

12. A semiconductor memory device comprising:

a gate stack structure having a surface extending in a first direction and a second direction, which intersect each other, the gate stack structure including a plurality of conductive patterns disposed to be spaced apart from each other in a third direction intersecting the surface;

first to third channel structures disposed inside the gate stack structure, the first to third channel structures having a cross-sectional structure including a major axis facing in the first direction and a minor axis facing in the second direction, the first to third channel structures being arranged substantially at apexes of a triangle;

a memory layer between each of the first to third channel structures and the gate stack structure;

first to third bit lines disposed above the gate stack structure, the first to third bit lines being arranged to be spaced apart from each other in a direction in which the major axis of each of the first to third channel structures faces; and first to third conductive contact structures connecting the first to third bit lines to the first to third channel structures respectively, and further comprising a fourth bit line and a fifth bit line, and wherein the first bit line, the fourth bit line and the fifth bit line overlap with the first channel structure.

13. The semiconductor memory device of claim 12, wherein the cross-sectional structure of each of the first to third channel structures has substantially an elliptical shape.

14. The semiconductor memory device of claim 12, wherein the first conductive contact structure and the first bit line are aligned at a central point of the first channel structure, wherein the second conductive contact structure and the second bit line are aligned at a central point of the second channel structure, and wherein the third conductive contact structure the third bit line are aligned at a central point of the third channel structure.

15. The semiconductor memory device of claim 12, wherein the second channel structure and the third channel structure are arranged in a line in the first direction, and wherein the first channel structure is spaced apart from the second channel structure and the third channel structure in the second direction.

16. The semiconductor memory device of claim 15, wherein the first bit line overlaps with the central point of the first channel structure, the second bit line overlaps with the central point of the second channel structure, and the third bit line overlaps with the central point of the third channel structure.

17. The semiconductor memory device of claim 16, wherein the fourth bit line is disposed between the first bit line and the second bit line, wherein the fourth bit line extends in the second direction to overlap with the second channel structure, wherein the fifth bit line is disposed between the first bit line and the third bit line, and wherein the fifth bit line extending in the second direction to overlap with the third channel structure.

* * * * *